United States Patent
Pollock et al.

(10) Patent No.: US 8,304,330 B2
(45) Date of Patent: Nov. 6, 2012

(54) METHOD FOR LOW TEMPERATURE ION IMPLANTATION

(75) Inventors: John D. Pollock, Rowley, MA (US); Zhimin Wan, Sunnyvale, CA (US); Erik Collart, North Andover, MA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 0 days.

(21) Appl. No.: 13/351,334

(22) Filed: Jan. 17, 2012

(65) Prior Publication Data

US 2012/0115318 A1    May 10, 2012

Related U.S. Application Data

(62) Division of application No. 12/750,983, filed on Mar. 31, 2010, now Pat. No. 8,124,508.

(51) Int. Cl.
*H01L 21/425* (2006.01)
(52) U.S. Cl. .................................. 438/514; 438/530
(58) Field of Classification Search .................. None
See application file for complete search history.

(56) References Cited

U.S. PATENT DOCUMENTS

| | | | |
|---|---|---|---|
| 5,244,820 A | 9/1993 | Kamata et al. | |
| 5,602,045 A | 2/1997 | Kimura | |
| 6,239,441 B1 | 5/2001 | Suguro et al. | |
| 6,365,492 B1* | 4/2002 | Suguro et al. | 438/514 |
| 6,372,611 B1* | 4/2002 | Horikawa | 438/473 |
| 6,423,605 B1* | 7/2002 | Sklyarevich et al. | 438/378 |
| 6,737,724 B2 | 5/2004 | Hieda et al. | |
| 7,709,364 B1* | 5/2010 | Jen et al. | 438/514 |
| 7,759,208 B1 | 7/2010 | Frye et al. | |
| 7,868,306 B2 | 1/2011 | Ramappa | |
| 2001/0033002 A1 | 10/2001 | Norcott et al. | |
| 2008/0090392 A1 | 4/2008 | Singh et al. | |
| 2008/0124903 A1 | 5/2008 | England et al. | |
| 2009/0305489 A1 | 12/2009 | Fish | |
| 2010/0084117 A1 | 4/2010 | Fish et al. | |

* cited by examiner

*Primary Examiner* — Scott B Geyer
(74) *Attorney, Agent, or Firm* — Rosenberg, Klein & Lee

(57) ABSTRACT

Techniques for low temperature ion implantation are provided to improve the throughput. During a low temperature ion implantation, an implant process may be started before the substrate temperature is decreased to be about to a prescribed implant temperature by a cooling process, and a heating process may be started to increase the substrate temperature before the implant process is finished. Moreover, one or more temperature adjust process may be performed during one or more portion of the implant process, such that the substrate temperature may be controllably higher than the prescribe implant temperature during the implant process.

6 Claims, 7 Drawing Sheets

METHOD FOR LOW TEMPERATURE ION IMPLANTATION

CROSS-REFERENCE TO RELATED APPLICATION

This is a divisional application of U.S. patent application Ser. No. 12/750,983, filed Mar. 31, 2010, now U.S. Pat. No. 8,124,508, issued Feb. 28, 2012, the contents of each of which is incorporated herein by reference in its entirety.

BACKGROUND OF THE INVENTION

1. Field of the Invention

The present invention relates to ion implantation, and more especially, to low temperature ion implantation.

2. Background of the Related Art

It has been discovered that a relatively low substrate temperature during on implantation may be advantageous for formation of shallow junctions, especially ultra-shallow junctions, which is more and more important for continued miniaturization of the semiconductor devices. It also may be useful for enhancing the yield of the ion implantation.

At the start of the conventional low temperature ion implantation, a substrate is moved from an outside environment, such as an atmosphere environment, into an implanter before an implant process is started. As shown in FIG. 1a, a cooling process (from $t_c$ to $t_i$) is performed to cool the substrate temperature from about environment temperature ($T_R$), such as about 15~25° C., to about a prescribed implant temperature ($T_P$), such as about −15~25° C., which usually is lower than the freezing point of water and is the e-chuck temperature during the implant process Herein, the substrate can be cooled at least in a cassette outside the implanter, in a load-lock of the implanter, in a chamber of the implanter, and so on.

In general, a backside gas is applied to cool the substrate and it requires several seconds (even several minutes) to cool down the substrate. Referring still to the FIG. 1a, during the implant process (from $t_i$ to $t_h$), the substrate is heated by the ion beam energy and cooled by a cooling mechanism, such as a backside cooling gas. Usually, to ensure the implantation quality on the substrate during the implant process, the operation of the cooling mechanism is properly adjusted to ensure the substrate temperature is always essentially equal to the prescribed implant temperature or at least is not higher than an upper-limited temperature (TO during the implant process (from $t_i$ to $t_h$) Herein, the rise curve of the substrate temperature may be linear or non-linear. The rise curve during the implant process (from $t_i$ to $t_h$) shown in FIG. 1 a is only a sketch. On the other hand, if the upper-limited temperature is close to the prescribed implant temperature, as shown in FIG. 1b, the rise curve during the implant process (from $t_i$ to $t_h$) shown in FIG. 1b may be a simplified as a horizontal straight line.

After finishing the implant process, referring still to FIG. 1a or FIG. 1b, a heating process (from $t_h$ to $t_f$) is performed to heat the implanted substrate to a quasi-environment temperature ($T_R'$), and then the implanted substrate is moved out the implanter to the outside environment for subsequent semiconductor fabrication. Herein, the quasi-environment temperature may be close to a temperature of the atmosphere environment or higher than a dew point of water in the outside environment. Hence, the water condensation problem on the substrate surface induced by the temperature difference may be avoidable.

In the foregoing processes, it requires several seconds (even some minutes) to cool down the substrate from the environment temperature to the prescribed implant temperature. Also, it requires several seconds (even some minutes) to heat up the implanted substrate from the prescribed implant temperature to the quasi-environment temperature. Moreover, to ensure the uniformity and quality of the implant process, both the cooling process and the heating process are separated from the implant process during the low temperature ion implantation. However, both the cooling process and heating process are time-consuming, so that the throughput of the low temperature ion implantation is limited.

Accordingly, there is a need to propose a novel and effective approach to improve the low temperature ion implantation.

SUMMARY OF THE INVENTION

Accordingly, one embodiment provides a method for low temperature ion implantation. In the beginning, move a substrate from an outside environment into a chamber, wherein the outside environment has an outside environment temperature. Next, perform a cooling process to cool the substrate to let a substrate temperature be lower than the outside environment temperature. Then, perform the cooling process and an implant process to simultaneously cool and implant the substrate. And then, continue to perform the implant process to implant the substrate after the cooling process is finished. After that, perform a heating process to heat the substrate after the implant process is finished. Finally, move the substrate from the chamber to the outside environment.

Another embodiment provides a method for low temperature ion implantation. In the beginning, move a substrate from an outside environment into a chamber, wherein the outside environment has an outside environment temperature. Next, perform a cooling process to cool the substrate to let a substrate temperature be lower than the outside environment temperature. Then, perform an implant process to implant the substrate after the cooling process is finished. And then, perform a heating process and the implant process to simultaneously heat and implant the substrate. After that, continue to perform the heating process to heat the substrate after the implant process is finished. Finally, move the substrate from the chamber to the outside environment.

Another embodiment provides a method for low temperature ion implantation. In the beginning, provide an ion beam in a chamber and move a substrate from an outside environment into the chamber. Next, perform a cooling process to cool the substrate. Then, perform an implant process to implant the substrate, wherein one or more temperature adjust process and one or more portion of the implant process is performed simultaneously. And then, perform a heating process to heat the substrate. Finally, move the substrate out the chamber into the outside environment.

DETAILED DESCRIPTION OF THE INVENTION

The detailed description of the present invention will be discussed in the following embodiments, which are not intended to limit the scope of the present invention, but can be adapted for other application. While drawings are illustrated in details, it is appreciated that the quantity of the disclosed components may be greater or less than that disclosed, except expressly restricting the amount of the components.

During the below discussion and the related figures, the difference between prescribed implant temperature and the upper-limited temperature is not particularly emphasize to simplify the discussion and figures. Indeed, some discussions and figures will assume they are different, and other discussions and figures will assume they are equivalent (or at least the difference may be omitted). However, the invention is not limited by the difference between prescribed implant temperature and the upper-limited temperature, any one skilled in the art may add it into the below discussion and the related figures.

Figure 1A:
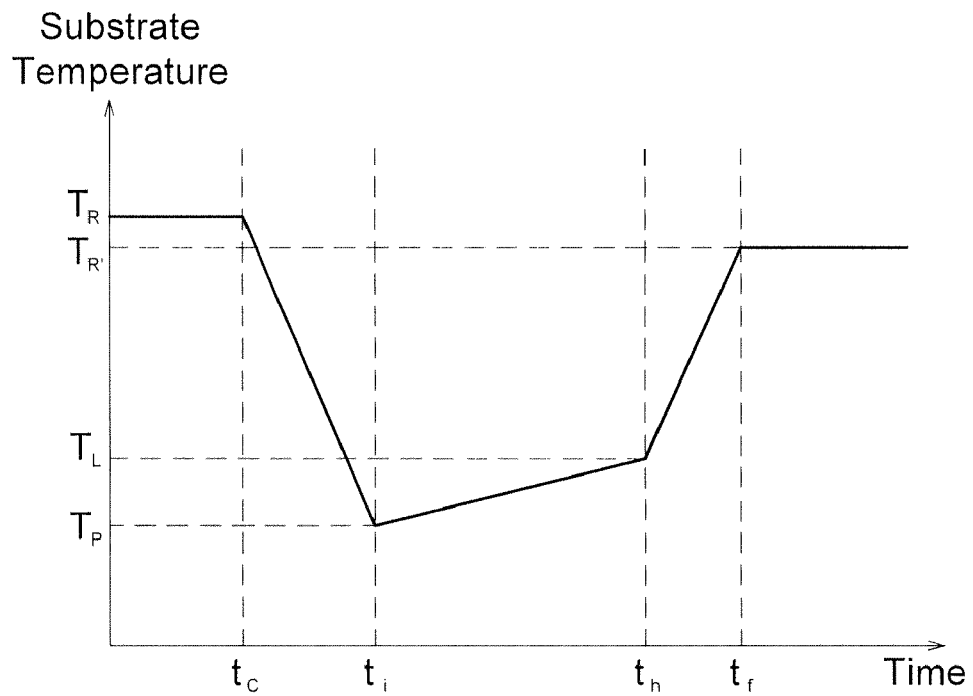
FIG. 1a and FIG. 1b are two diagrams illustrating the relationship between the substrate temperature and the time, during the conventional low temperature ion implantation.
Figure 1B:
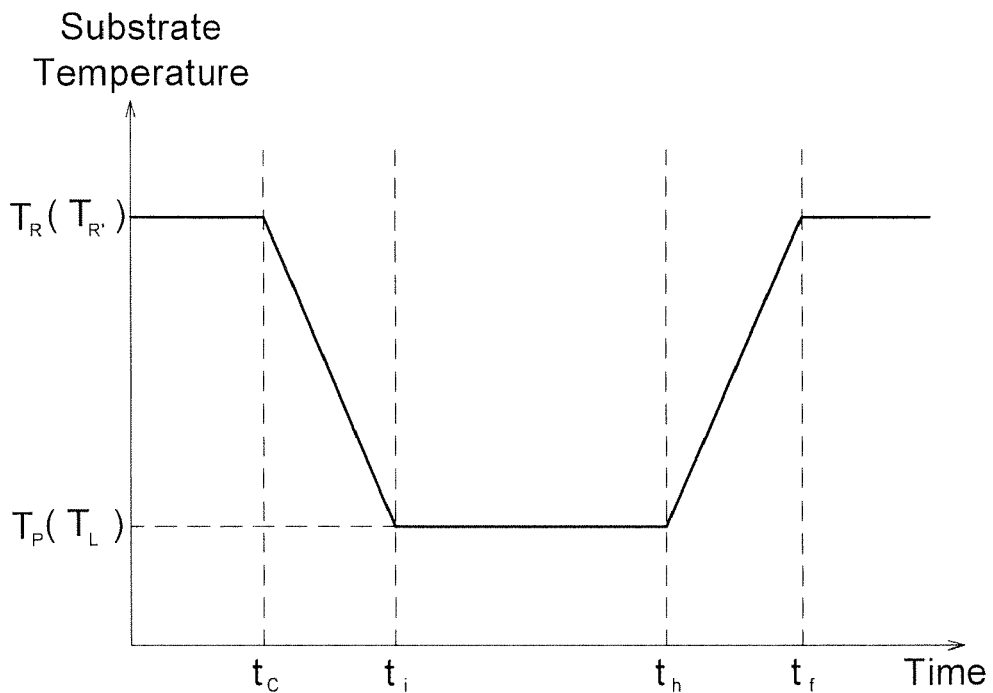
Figure 2:
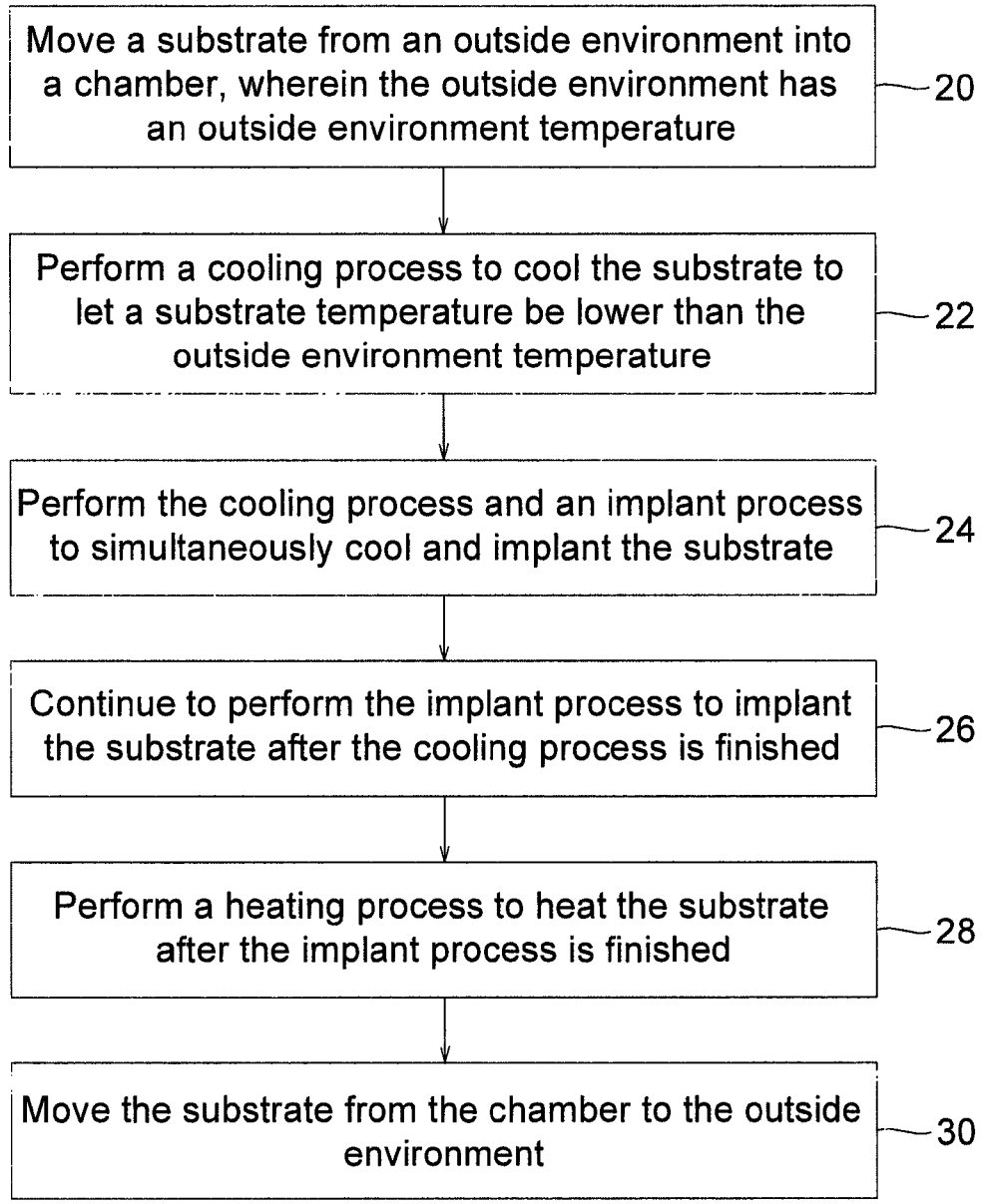
FIG. 2 is a flow chart illustration of a method for low temperature on implantation in accordance with an embodiment of the present invention.

FIG. 2 is a flow chart illustration of a method for low temperature ion implantation in accordance with an embodiment of the present invention. In step 20, move a substrate from an outside environment into a chamber, wherein the outside environment has an outside environment temperature In step 22, perform a cooling process to cool the substrate to let a substrate temperature be lower than the outside environment temperature. In step 24, perform the cooling process and an implant process to simultaneously cool and implant the substrate. In step 26, continue to perform the implant process to implant the substrate after the cooling process is finished. In step 28, perform a heating process to heat the substrate after the implant process is finished. In step 30, move the substrate from the chamber to the outside environment.

Figure 3:
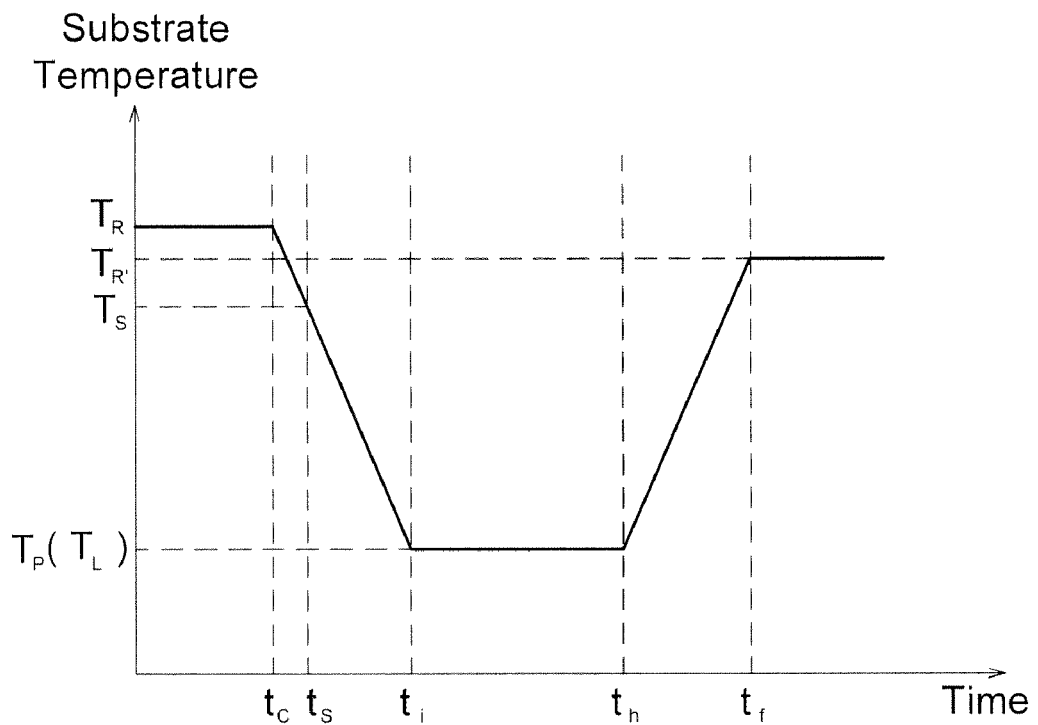
FIG. 3 is a diagram illustrating the relationship between the substrate temperature and the time, during the low temperature ion implantation, in accordance with another embodiment of the present invention.

FIG. 3 is a diagram illustrating the relationship between the substrate temperature and the time, during the low temperature ion implantation in accordance with another embodiment of the present invention. In this embodiment, the implant process is partially overlapped with the cool process.

In the beginning, a cooling process is performed to cool the substrate from about the environment temperature to a lower temperature from the time of $t_c$ to $t_i$. During the cooling process, the implant process is started when reaching a temperature $T_S$ corresponding to a time of $t_s$, wherein the temperature $T_S$ is between the environment temperature and the prescribed implant temperature, and optionally is significantly higher than the prescribed implant temperature. Accordingly, the implant process is performed accompanying the cooling process from the time of $t_s$ to $t_i$. Herein, from the time of $t_s$ to $t_i$, the substrate temperature may be decreased to be substantially equal to the prescribed implant temperature. Furthermore, a ratio of a period that simultaneously implants and cools the substrate from $t_s$ to $t_i$ to a total period of the cooling process from $t_c$ to $t_i$ is not larger than half. Also, the cooling process is finished no later than a middle of the implant process, and the upper-limited temperature is assumed to be equal to the prescribed implant temperature.

At time of $t_i$, the cooling process is finished, and the implant process is continuously performed to implant the substrate until the implant process is finished at time of $t_h$. After the implant process is finished, the heating process (from $t_h$ to $t_f$) is performed to heat the implanted substrate to the quasi-environment temperature ($T_R'$), which may be equal to or lower than the environment temperature ($T_R$). Finally, the implanted substrate is moved out the implanter to the environment for the following semiconductor fabrication.

Figure 4:
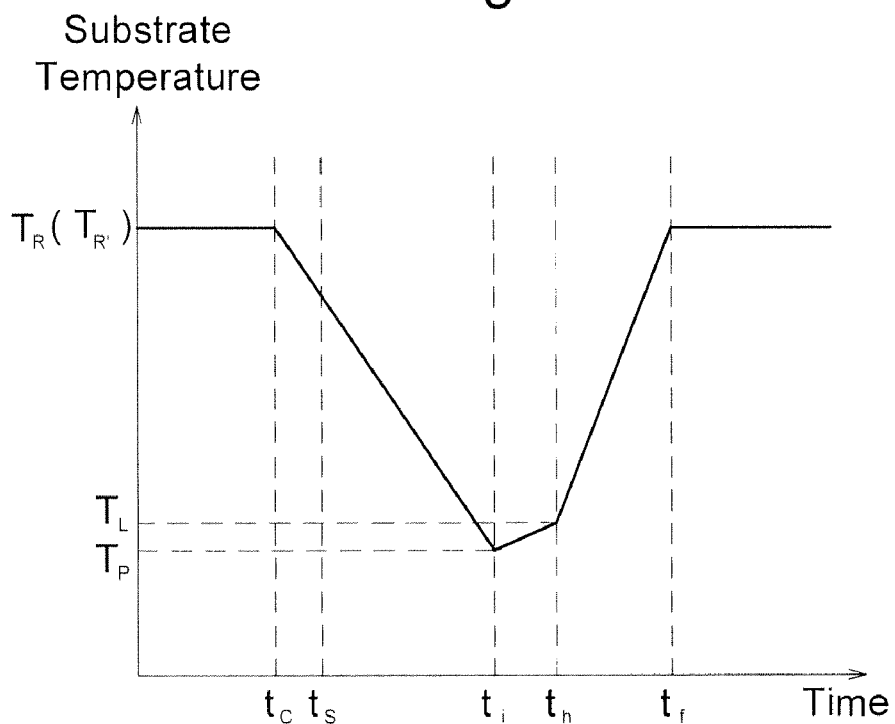
FIG. 4 is a diagram illustrating the relationship between the substrate temperature and the time, during the low temperature ion implantation, in accordance with another embodiment of the present invention.

FIG. 4 is a diagram illustrating the relationship between the substrate temperature and the time, during the low temperature ion implantation in accordance with another embodiment of the present invention. Similar to the previous embodiment, before the substrate temperature decreases to the prescribed implant temperature, the implant process is performed accompanying the cooling process from the time of $t_s$ to $t_i$. But, in this embodiment, a ratio of a period that the substrate is simultaneously implanted and cooled to a total period of the cooling process from $t_c$ to $t_i$ is not smaller than half, and the cooling process is finished no later than a middle of the implant process. Also the upper-limited temperature is assumed to be obviously higher than the prescribed implant temperature.

Besides, how the substrate temperature is varied during the time of $t_s$ to $t_i$ is not limited in this invention, although both FIG. 3 and FIG. 4 shows that substrate temperature is decreased to be substantially equal to the prescribed implant temperature. Indeed, owing to the heat produced by the ion beam energy during the implant process, during the time of $t_s$ to $t_i$, t the substrate temperature also may be decreased to a specific temperature higher than the prescribed implant temperature, or even be increased to a temperature higher than the Ts. However, the characteristic of these embodiments is the overlap between the cooling process and the implant process, and then both FIG. 3 and FIG. 4 only show a simple case to simplify the drawings and related discussion.

Figure 5:
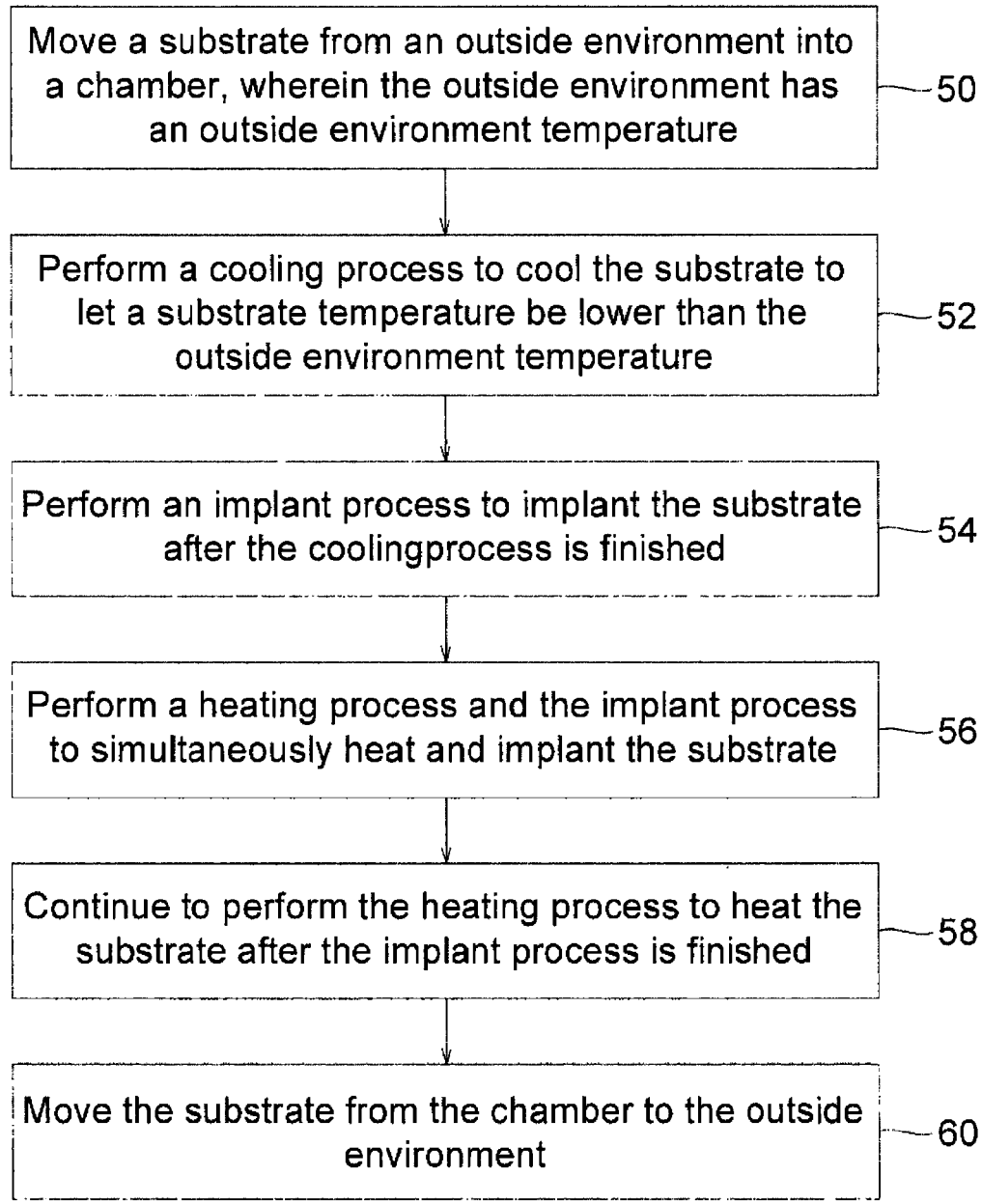
FIG. 5 is a flow chart illustration of a method for low temperature ion implantation in accordance with another embodiment of the present invention.

FIG. 5 is a flow chart illustration of a method for low temperature ion implantation in accordance with another embodiment of the present invention. In step 50, move a substrate from an outside environment into a chamber, wherein the outside environment has an outside environment temperature In step 52, perform a cooling process to cool the substrate to let a substrate temperature be lower than the outside environment temperature In step 54, perform an implant process to implant the substrate after the cooling process is finished. In step 56, perform a heating process and the implant process to simultaneously heat and implant the substrate. In step 58, continue to perform the heating process to heat the substrate after the implant process is finished. In step 60, move the substrate from the chamber to the outside environment.

Figure 6:
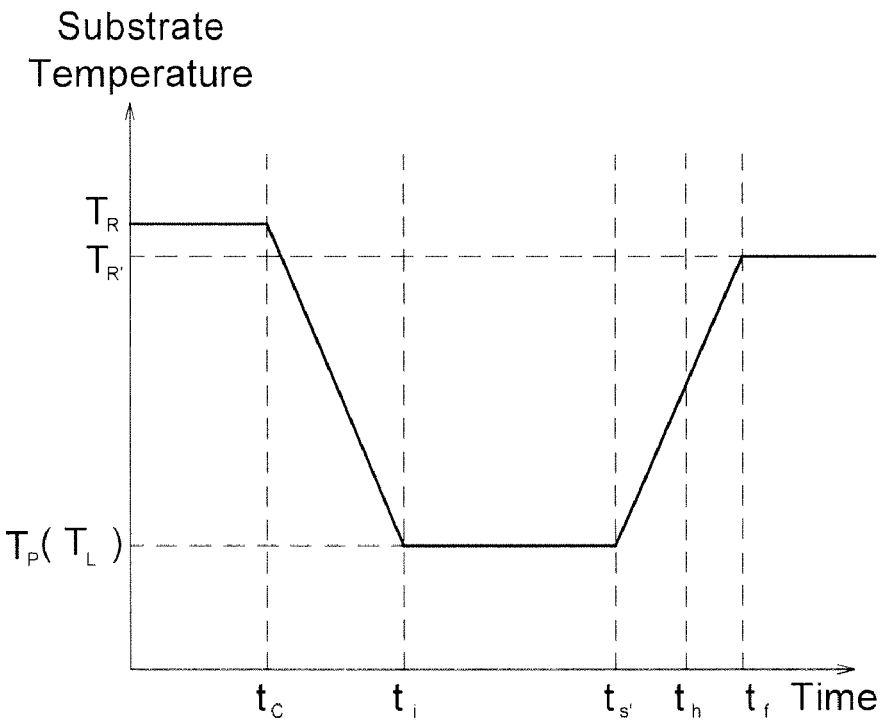
FIG. 6 is a diagram illustrating the relationship between the substrate temperature and the time, during the low temperature ion implantation, in accordance with another embodiment of the present invention.

FIG. 6 is a diagram illustrating the relationship between the substrate temperature and the time during the low temperature ion implantation in accordance with another embodiment of the present invention. In this embodiment, the implant process does not overlap with the cooling process, but partially overlaps with the heating process.

Significantly, one main characteristic is that the heating process starts at time of $t_{s'}$, which is between $t_i$ and $t_h$, before the implant process (from $t_i$ to $t_h$) is finished. Moreover, it is optional to keep the temperature of the implanted substrate not higher than the upper-limited temperature to ensure the implantation quality during the period from $t_{s'}$ and $t_h$, and also is optional to allow the temperature of the implanted substrate higher than the upper-limited temperature during the period from $t_{s'}$ and $t_h$ as the implantation quality of the whole implant process is acceptable. After the implant process is finished at time of $t_h$, the heating process may be performed to heat the implanted substrate until the temperature of the implanted substrate increases to the quasi-environment temperature ($T_R'$) at time of $t_f$. At such point, the implanted substrate is moved out the implanter to the environment for the next semiconductor fabrication step. Furthermore, as shown in FIG. 6, a ratio of a period that simultaneously implant and heat the substrate from $t_{s'}$ to $t_h$ to a total period of the heating process from $t_{s'}$ to $t_f$ is not larger than half. Also, the heating process is started not earlier than a middle of the implant process, and the upper-limited temperature is assumed to essentially equal to the prescribed implant temperature.

Figure 7:
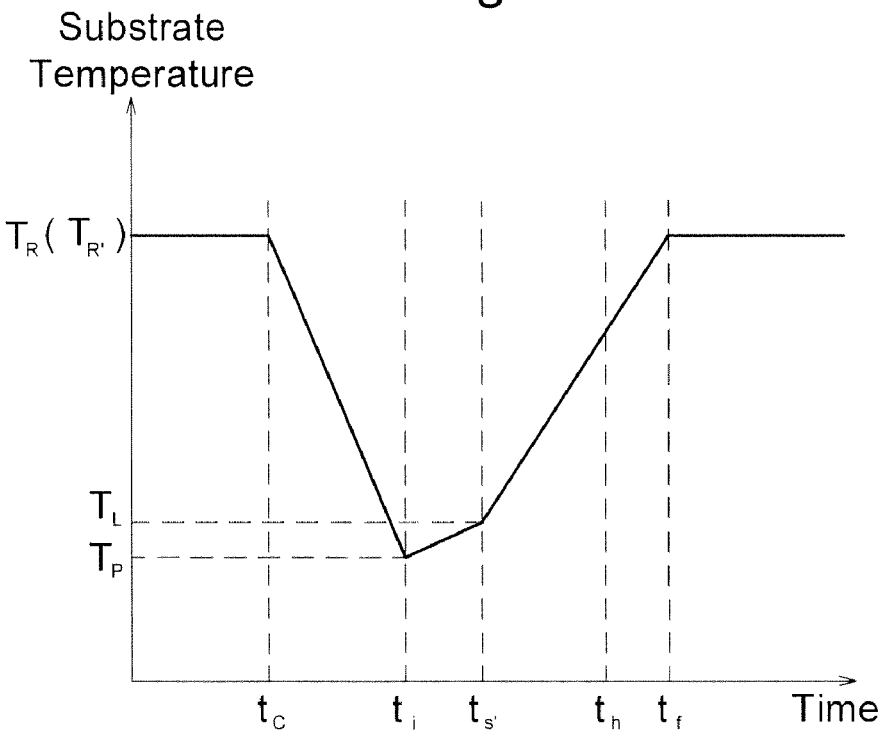
FIG. 7 is a diagram illustrating the relationship between the substrate temperature and the time, during the low temperature ion implantation, in accordance with another embodiment of the present invention.

FIG. 7 is a diagram illustrating the relationship between the substrate temperature and the low temperature ion implantation timing in accordance with another embodiment of the present invention. Similar to the above embodiment, the heating process is started during the implant process, but a ratio of a period that simultaneously implant and cool the substrate to a total period of the heating process is not smaller than half, also the upper-limited temperature is assumed to be obviously higher than the prescribed implant temperature. Besides, what the substrate temperature is at the starting of the heating process is not particularly limited.

Significantly, in the foregoing embodiments, one main characteristic is that at least part of the cooling process or heating process may be overlapped with at least part of the implant process. Therefore, the throughput of the low temperature ion implantation may be improved, because the overlap between any two processes may decrease the period required to finish the two processes. Of course, the overlapped ratio should be properly adjusted to balance the throughput and the implantation quality. For example, to further improve the throughput, the majority of the implant process may be processed accompanying the cooling process as shown in FIG. 4, or accompanying the heating process as shown in FIG. 7. For example, to further uniformly implant the substrate, the majority of the implant process may be processed alone as shown in FIG. 3 and FIG. 6. Further, both the prescribed implant temperature and the temperature ($T_S$), at which the implant process is started accompanying the cooling process, usually are lower than the freezing point of water, because the general requirements of low temperature ion implantation. In other words, the implant process usually is started after the substrate temperature is low enough to have the benefits of low temperature implantation.

The temperature adjustment in the above embodiments may be simply achieved. For example, when the ion beam power is fixed and the backside cooling gas pressure is adjustable, the partial overlap between the implant process and the cooling process can be simplify achieved by bringing forward the start of projecting an ion beam on the substrate, also the partial overlap between the implant process and the heating process can be simplify achieved by bringing forward the start of decreasing the backside gas pressure. Of course, these embodiments also can be simply achieved by adjusting the ion beam power. For example, the partial overlap between the implant process and the heating process can be simply achieved by increasing the ion beam power without decreasing the backside gas pressure. Besides, as another example, a lamp may be used to heat the substrate during the implant process, such that the substrate temperature may be adjusted by changing the power of the lamp.

Figure 8:
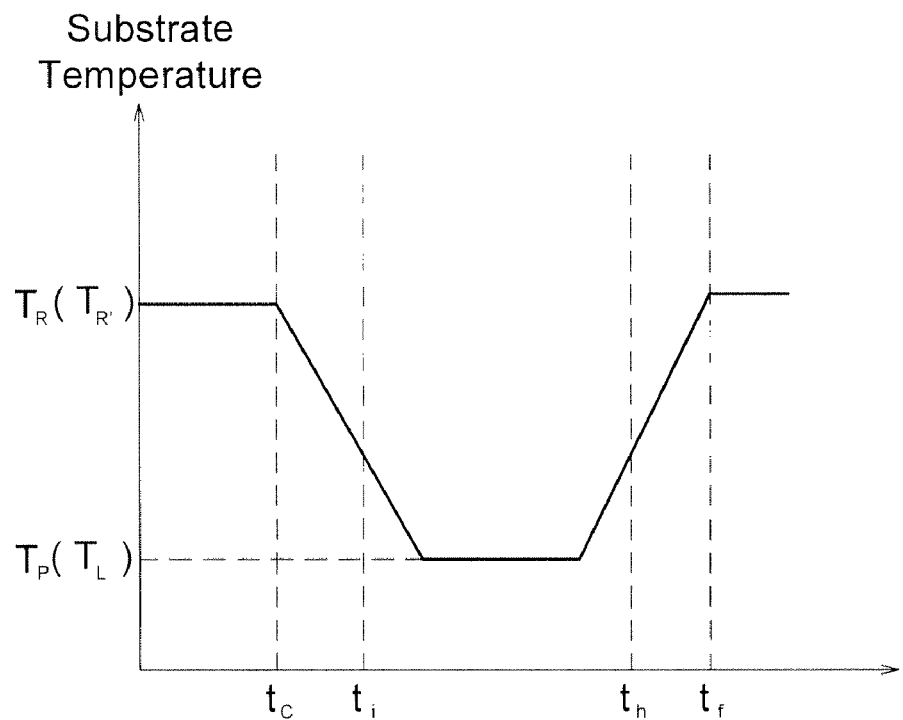
FIG. 8 is a diagram illustrating the relationship between the substrate temperature and the time, during the low temperature ion implantation, in accordance with another embodiment of the present invention.

FIG. 8 is a diagram illustrating a relation between the substrate temperature and the time, during the low temperature ion implantation in accordance with one more embodiment of the present invention. As shown in FIG. 8, the implant process (from $t_s$ to $t_h$) partially overlaps with both the cooling process (from $t_c$ to $t_i$) and the heating process (from $t_{s'}$ to $t_f$). Herein, to simplify the figure and the discussion, the upper-limited temperature is assumed to be equal to the prescribe implant temperature in this embodiment. Reasonably, the throughput may be further improved because the significant overlap between these processes.

Furthermore, the overlap between the implant process and the cooling process (and/or the heating process) can be viewed as applying extra heat to the implanted substrate during portions of the implant process. Note that the cooling process is used to decrease the substrate temperature from a higher temperature to the proper temperature region required by the implant process and the heating process is used to increase the substrate temperature from the proper temperature region required by the implant process to a higher temperature. Reasonably, the extra heating will have some effects on the implanted substrate. For example, it will affect the distribution of the displaced Si atoms, which will affect and drive subsequent diffusion and activation of the implanted impurities. Although each variation of substrate temperature during the ion implant process has its corresponding effect(s), similar effect(s) may be induced by different variations of substrate temperature during the ion implant process. For example, the effect of a period of 10 seconds which the temperature of the implanted substrate is in a specific temperature higher than the prescribed implant temperature may be essentially equal to the effect of two separate periods of 5 seconds which the temperature of the implanted substrate is in the specific temperature.

Figure 9:
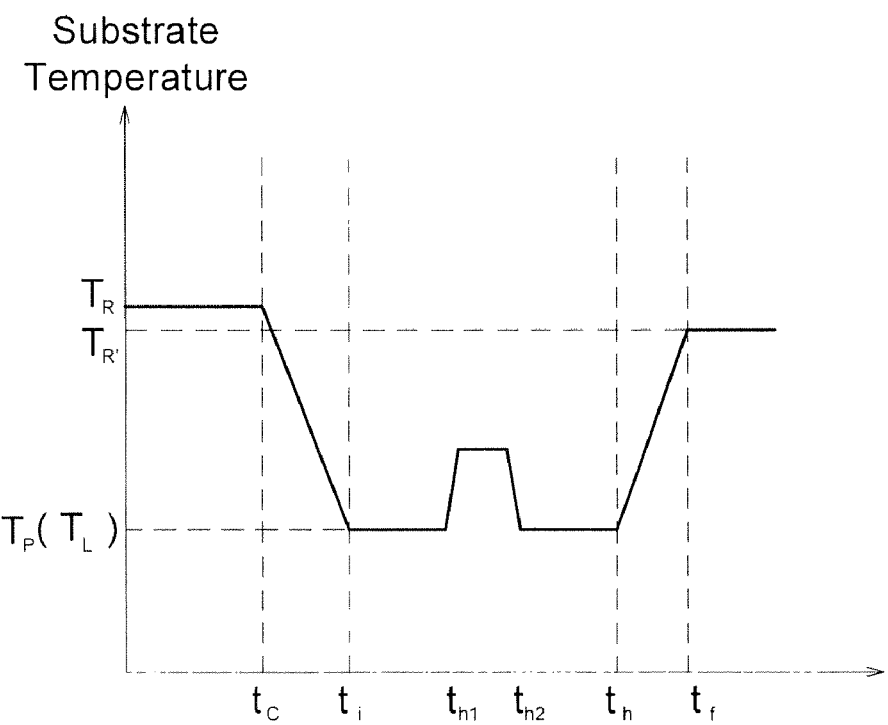
FIG. 9 is a diagram illustrating the relationship between the substrate temperature and the time, during the low temperature ion implantation, in accordance with another embodiment of the present invention.

Accordingly, the implantation result on the implanted substrate in the embodiment as shown in FIG. 8 may be equal to the implantation result on the implanted substrate in another embodiment as shown in FIG. 9. Herein, the extra heating applied to the implanted substrate by the overlap with the cooling/heating processes (as shown in FIG. 8) is equal to the extra heating applied to the implanted substrate by an extra heating process during a middle portion of the implant process (from $t_{h1}$ to $t_{h2}$) (as shown in FIG. 9). Of course, as briefly discussed above, another potential equivalent embodiment is that the extra heating is applied to implanted substrate by two different extra heating process during different portions of the implant process (from $t_{h3}$ to $t_{h4}$ and from $t_{h6}$ to $t_{h6}$) (not shown in any figure). Furthermore, depending on the details of different embodiments, the invention may not limit how many extra heating process(es) is performed, how the substrate temperature variation is during each extra heating process, even whether the extra heating process is overlapped with the cooling process (and/or the heating process) or not.

Figure 10:
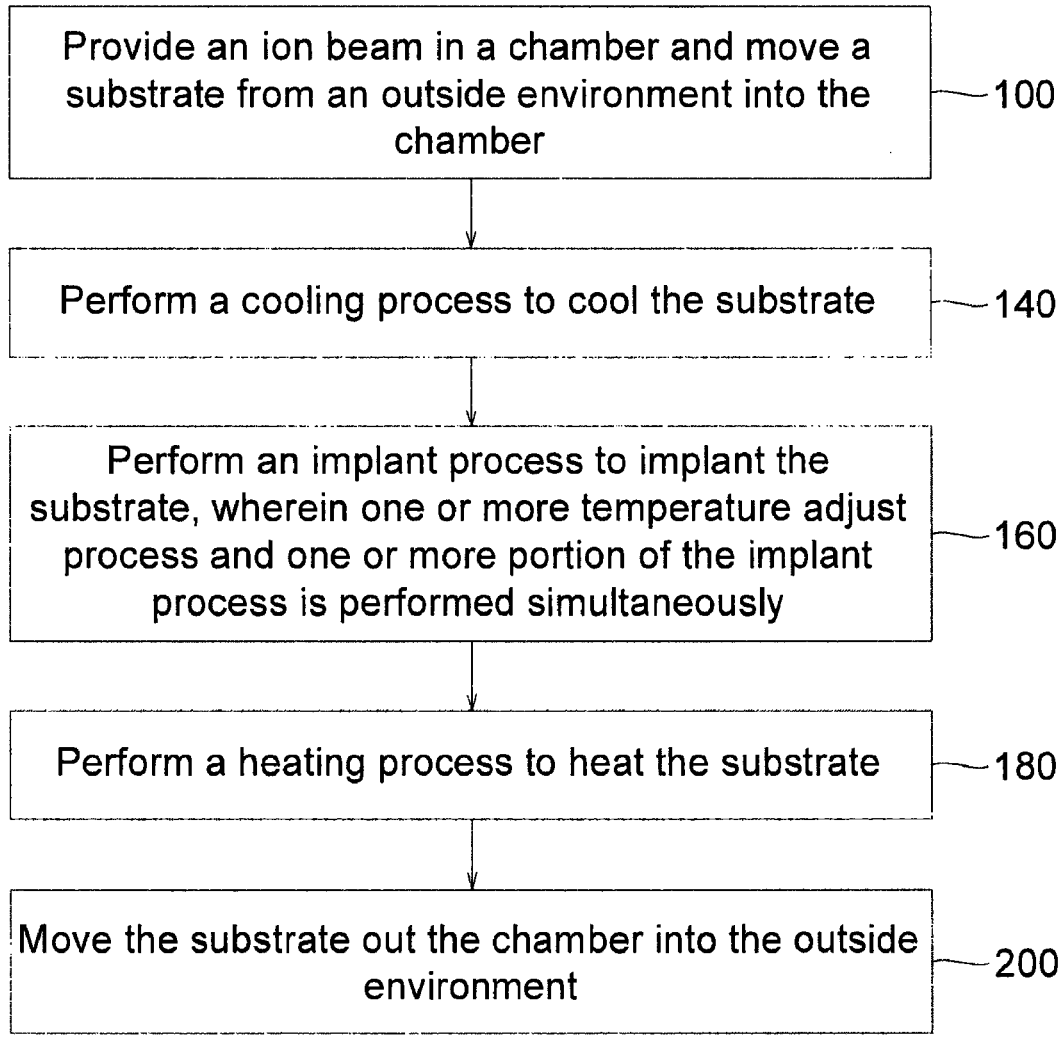
FIG. 10 is a flow chart illustration of a method for low temperature ion implantation in accordance with another embodiment of the present invention.

Accordingly, FIG. 10 is a flow chart illustration of a method for low temperature ion implantation in accordance with an embodiment of the present invention. In step 100, provide an ion beam in a chamber and move a substrate from an outside environment into the chamber. In step 120, perform a cooling process to cool the substrate. In step 140, perform an implant process to implant the substrate, wherein one or more temperature adjust process and one or more portion of the implant process is performed simultaneously. In step 160, perform a heating process to heat the substrate. In step 180, move the substrate out the chamber into the outside environment.

Similarly, in this embodiment, the ratio of a period that the temperature adjust process is performed to a total period of the implant process is not limited, it can be larger than, equal to or smaller than half. Besides, the implant process may be started before the substrate temperature is decreased by the cooling process to be substantially equal to a prescribed implant temperature, and the heating process may be finished when the substrate temperature is not lower than a dew point of water in the outside environment. Further, no matter for which of the cooling process, the heating process and the extra heating process, it may be achieved by using a gas to cool a backside of the substrate and adjust temperature of substrate by changing a pressure of the gas, and also may be achieved by using a lamp to heat the substrate and adjust temperature of the substrate by changing a power of the lamp.

Of course, it is desired to strike a balance between the throughput and the implantation quality. Hence, the variation of the substrate temperature should be properly adjusted during the implant process. For example, the overlap between the implant process and the cooling/heating process will reduce a period which the substrate temperature is essentially equal to the prescribed implant temperature during the implant process. Hence, for the same implantation requirement(s), such as same implanted depth and the same implanted dose, it is optional that the prescribed implant temperature of an embodiment of the invention is different than the prescribed implant temperature of another embodiment of the invention, even is different than the prescribed implant temperature of each prior art. Besides, the substrate temperature is optionally lower than the prescribed implant temperature during a specific portion of the implant process (i.e., extra cool process is performed).

Although the present invention has been explained in relation to its preferred embodiment, it is to be understood that other modifications and variation can be made without departing the spirit and scope of the invention as hereafter claimed.

What is claimed is:

1. A method for low temperature ion implantation, comprising:
    moving a substrate from an outside environment into a chamber, wherein said outside environment has an outside environment temperature;
    performing a cooling process to cool said substrate to let a substrate temperature be lower than said outside environment temperature;
    perform an implant process to implant said substrate after said cooling process is finished;
    performing a heating process and said implant process to simultaneously heat said substrate and implant said substrate, wherein said heating process and said implant process is performed simultaneously after said substrate temperature is substantially equal to a prescribed implant temperature;
    continuing to perform said heat process to heat said substrate after said implant process is finished; and
    moving said substrate from said chamber to said outside environment.

2. The method for low temperature ion implantation according to claim 1, wherein a ratio of a period that simultaneously implant and heat said substrate to a total period of said heating process is not larger than half.

3. The method for low temperature ion implantation according to claim 1, wherein a ratio of a period that simultaneously implant and heat said substrate to a total period of said heating process is not smaller than half.

4. The method for low temperature ion implantation according to claim 1, wherein said heat process is started not earlier than a middle of said implant process.

5. The method for low temperature ion implantation according to claim 1, wherein said heating process is finished when said substrate temperature is not lower than a dew point of water in said outside environment.

6. The method for low temperature ion implantation according to claim 1, further comprising using one or more of the following:
    using a gas to cool a backside of said substrate and adjusting said substrate temperature by changing a pressure of said gas; and
    using a lamp to heat said substrate and adjusting said substrate temperature by changing a power of said lamp.

* * * * *